(12) United States Patent
Park

(10) Patent No.: US 6,285,573 B1
(45) Date of Patent: Sep. 4, 2001

(54) SEMICONDUCTOR INTEGRATED CIRCUIT HAVING SHIELD WIRE

(75) Inventor: Chan-jong Park, Seoul (KR)

(73) Assignee: Samsung Electronics Co., LTD (KR)

( * ) Notice: Subject to any disclaimer, the term of this patent is extended or adjusted under 35 U.S.C. 154(b) by 0 days.

(21) Appl. No.: 09/514,744

(22) Filed: Feb. 28, 2000

(30) Foreign Application Priority Data

Jul. 13, 1999 (KR) .................................................. 99-28210

(51) Int. Cl.[7] .................................................. G11C 7/02
(52) U.S. Cl. ............................ 365/53; 365/102; 365/149
(58) Field of Search .............................. 365/53, 54, 102, 365/149

(56) References Cited

U.S. PATENT DOCUMENTS

| | | | |
|---|---|---|---|
| 4,514,749 | 4/1985 | Shoji | 357/68 |
| 4,958,222 | 9/1990 | Takakura et al. | 357/84 |
| 5,483,110 | * 1/1996 | Koide et al. | 307/147 |
| 5,616,952 | * 4/1997 | Nakano et al. | 257/659 |

* cited by examiner

Primary Examiner—David Nelms
Assistant Examiner—Thong Le
(74) Attorney, Agent, or Firm—Mills & Onello LLP

(57) ABSTRACT

A semiconductor integrated circuit includes a plurality of signal wires and an array of capacitor-based memory cells. The capacitors of the memory cells are electrically coupled to a common voltage source node where a voltage source provides supply power to the array. Shield wires positioned proximal to the signal wires are electrically coupled to the common voltage source node. A shield capacitor may be provided between the signal wires and the common voltage source node to provide further noise suppression.

12 Claims, 3 Drawing Sheets

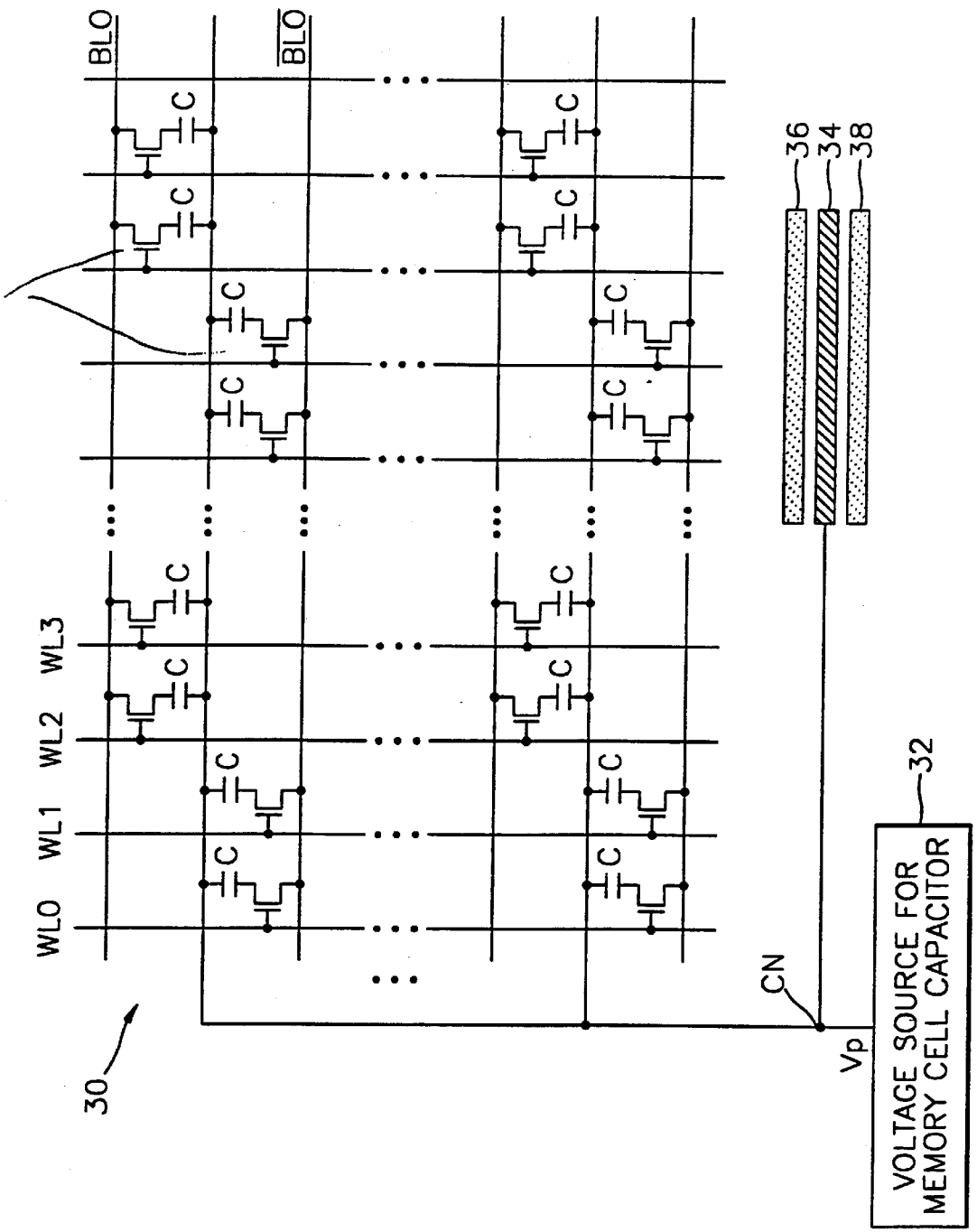

SEMICONDUCTOR INTEGRATED CIRCUIT HAVING SHIELD WIRE

BACKGROUND OF THE INVENTION

1. Field of the Invention

The present invention relates to a semiconductor integrated circuit, and more particularly, to a semiconductor integrated circuit having a shield wire.

2. Description of the Related Art

Throughout the development of high-speed computer systems, research into the enhancement of data processing speed of semiconductor integrated circuits has been continuous and vigorous. With ever-increasing data processing speed, designers are faced with the challenges of containing the increased interference between signal conductors, and of controlling increased noise generated during circuit operation. Thus, in order to maintain operating margins during high-speed operation, it is increasingly important to properly shield the generated interference and noise from primary signal conductors in order to avoid improper signal transitions.

FIG. 1 illustrates a first conventional technique for signal wire shielding in a semiconductor integrated circuit. In this example, neighboring signal conductors or wires 14 and 16 to be shielded are isolated from each other by a shield wire 12 electrically coupled to an external voltage source 10. The external voltage source in turn applies a positive or negative source voltage or a ground voltage to the shield wire. The stable voltage serves as a barrier to noise and interference.

FIG. 2 illustrates a second conventional technique for signal wire shielding in a semiconductor integrated circuit. In this example, the signal wire 24 is electrically coupled to a first terminal of a decoupling capacitor 22, and a second terminal of the decoupling capacitor 22 is electrically coupled to an external voltage source 20. In this configuration, any noise components induced on the signal wire 24 by noise and interference generating sources are applied to, and absorbed by, the external voltage source 20 or the ground port, and therefore are prevented from adversely affecting nearby signal wires.

During operation, the voltage applied by the external voltage source can vary due to corresponding variances in operating current. As a result, in the conventional shielding configurations of FIGS. 1 and 2, instead of noise suppression, noise can be actively introduced on the signal wires 14,16 via shield wire 12 (FIG. 1) or on signal wire 24 via decoupling capacitor 22 (FIG. 2). This, in turn, can cause the device to exhibit a reduced operating margin or worse, cause the device to malfunction.

SUMMARY OF THE INVENTION

In order to address the limitations of conventional techniques, it is an object of the present invention to provide a semiconductor integrated circuit having an enhanced shield wire configuration suitable for improving the operating characteristics.

Accordingly, to achieve the above object, there is provided a semiconductor integrated circuit including a plurality of signal wires and including a capacitor-based memory cell array. Capacitors in the array are coupled to a common voltage source node. At least one shield wire is positioned adjacent at least one signal wire. The at least one shield wire is electrically coupled to the common voltage source node.

In a preferred embodiment, a common electrical potential is applied to the common voltage source node of the memory cell capacitors, the electrical potential being different than that applied by an external voltage source. The at least one shield wire is preferably formed of a conductive material.

The at least one shield wire may be positioned between, or on opposite sides of, signal wires to be shielded. In the case where the circuit comprises a multiple-level circuit, the shield wires may be positioned between upper and lower levels to be shielded.

In accordance with another aspect of the present invention, a semiconductor circuit includes a capacitor-based memory cell array and a plurality of signal wires. Capacitors in the memory cell array are electrically coupled to a common voltage source node. The circuit comprises at least one shield capacitor, a first terminal of the shield capacitor being electrically coupled to the signal wire, and a second terminal of the shield capacitor being electrically coupled to the common voltage source node.

The shield capacitor preferably comprises a metal oxide silicon (MOS) capacitor.

In the semiconductor integrated circuit according to the present invention, the operating characteristics thereof can be improved by effectively shielding signal wires, without being adversely affected by variances in the voltage of external voltage sources and ground planes.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3 illustrates signal wire shielding for a semiconductor integrated circuit according to a first embodiment of the present invention.

DESCRIPTION OF THE PREFERRED EMBODIMENTS

Figure 1:
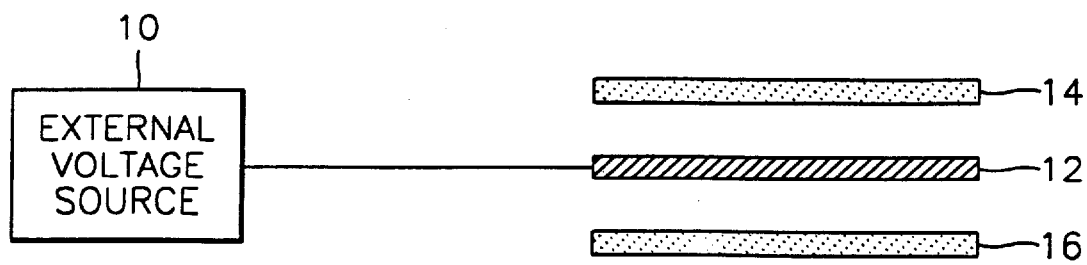
FIGS. 1 and 2 illustrate conventional techniques for signal wire shielding for a semiconductor integrated circuit.

In the present invention, a semiconductor integrated circuit includes memory cells that comprise capacitive storage devices. Such capacitor-based memory cell devices commonly include, in addition to an external voltage source, a secondary voltage source provided to a common port of the memory cell capacitors. The secondary memory cell voltage source is typically more stable in voltage level than the external voltage (or ground) source, and therefore is more suitable for generating a shielding voltage for supplying power to device shield wires.

FIG. 3 illustrates signal wire shielding for a semiconductor integrated circuit according to a first preferred embodiment of the present invention. In this embodiment, a memory cell array 30 comprises a plurality of capacitor-based C memory cells 31. A memory cell voltage source 32 supplies a voltage Vp to cells 31 in the array 30 via common node CN.

A shield wire 34 is provided between first and second adjacent signal wires 36, 38. The signal wires 36, 38 are not necessarily associated with the memory cell array 30, but instead may be part of the functionality of another portion of the semiconductor circuit. The shield wire 34 is electrically connected to a position along the common node CN of the memory cell capacitors C having memory cell voltage Vp applied thereto. The electrical potential of the common node CN of the memory cell capacitors may be different than that of the external voltage source.

Figure 2:
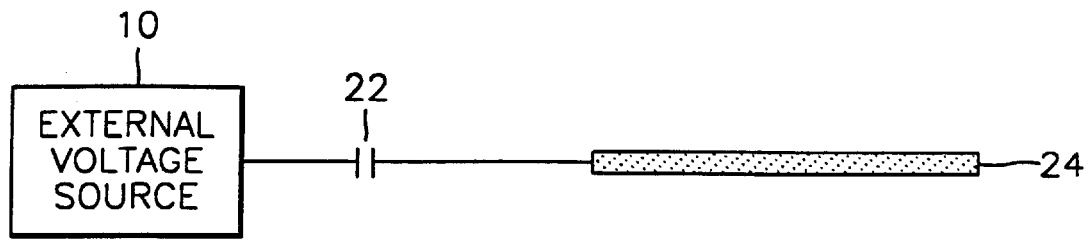

In general, the collective capacitance of the bank of cell capacitors in a capacitor-cell based dynamic random access memory (DRAM) is approximately equal to the number of memory cells×individual memory cell capacitance×0.1. In the case of a 64 Mbit DRAM, assuming a memory cell capacitance of 20 fF, the overall collective capacitance of the bank equals approximately 128 nF (64 M×20 Ff×0.1). This collective capacitance value is about ten times larger than that of a typical capacitance value, for example 10 nF, of a conventional decoupling capacitor 22 (see FIG. 2) described above. The additional capacitance provided by the capacitor bank helps to further suppress any voltage variation generated by the voltage source for the memory cell capacitors, for example by a factor of ten, over the suppression realized with the decoupling capacitor 22 of FIG. 2. Therefore, signals traversing the signal wires to be shielded 36, 38 by the shield wire 34 can be effectively protected from interference caused by signals of adjacent signal wires.

Figure 4:
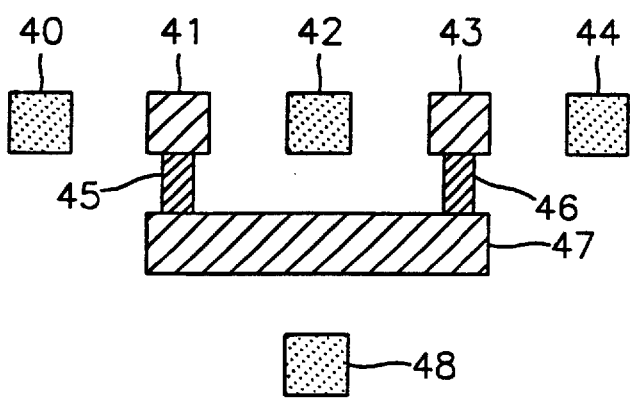
FIG. 4 is a schematic diagram of the shielding wire shielding configuration of FIG. 3, according to the present invention.

FIG. 4 illustrates an alternative shield wire configuration for the arrangement shown in FIG. 3, for example applicable to multiple-layered semiconductor configurations, such as silicon-on-insulator (SOI) technology. In this configuration, shield wires 41 and 43 shield a first signal wire 42 from second and third signal wires 40 and 44, all present on the same plane, or layer, of the semiconductor. Additionally, shield wire 47 shields the first signal wire 42 from a fourth signal wire 48 present in a lower layer of the semiconductor. The shield wires 41 and 43 are connected to each other by contact holes 45 and 46 formed between the semiconductor layers.

Figure 5:
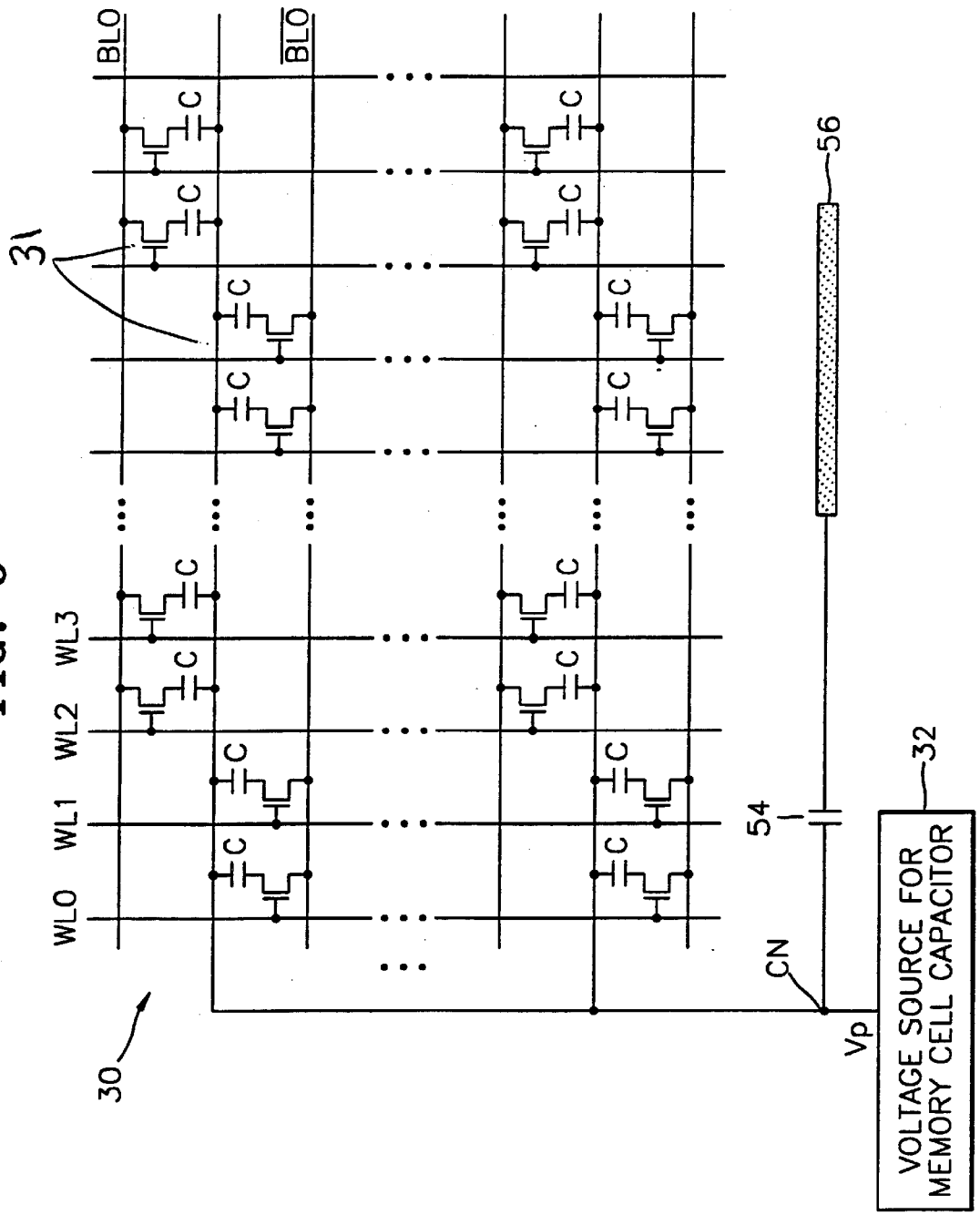
FIG. 5 illustrates signal wire shielding for a semiconductor integrated circuit according to a second embodiment of the present invention.

FIG. 5 illustrates signal wire shielding in a semiconductor integrated circuit according to a second preferred embodiment of the present invention. A first terminal of a decoupling capacitor 54 is electrically coupled to a signal wire 56 to be shielded. The second terminal of the decoupling capacitor 54 is electrically coupled to a common node CN of memory cell capacitors C in a memory cell array 30, as described above. As described above, the large collective capacitance of the memory cells serves to suppress variances in the voltage Vp provided by the memory cell voltage source 32 to a degree that is orders of magnitude greater than the suppression of the decoupling capacitor alone. Thus, noise components induced on signal wire 56 can be effectively eliminated.

In FIG. 5, the decoupling capacitor 54 preferably comprises an NMOS capacitor, a PMOS capacitor, or a depletion-type MOS capacitor. Since the voltage Vp of the voltage source 32 for memory cell capacitors is typically a predetermined, positive voltage, a contact shielding characteristic can be obtained by using a depletion-type MOS capacitor as the decoupling capacitor 54. This is because the depletion-type MOS capacitor commonly having a negative critical voltage exhibits a constant-capacitance value at positive voltages.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A semiconductor integrated circuit including a capacitor-based memory cell array, capacitors in the memory cell array being electrically coupled to a common memory cell voltage source node, said semiconductor integrated circuit including:

a plurality of signal wires; and at least one shield wire positioned adjacent at least one of the signal wires, the at least one shield wire being electrically coupled to the common memory cell voltage source node.

2. The semiconductor integrated circuit according to claim 1, wherein a common memory cell electrical potential is applied to the common memory cell voltage source node of the memory cell capacitors, the common memory cell electrical potential being different than that applied by an external voltage source.

3. The semiconductor integrated circuit according to claim 1, wherein the at least one shield wire is positioned between signal wires to be shielded.

4. The semiconductor integrated circuit according to claim 1, wherein multiple shield wires are positioned on opposite sides of signal wires to be shielded.

5. The semiconductor integrated circuit according to claim 1, wherein the signal wires are formed on multiple levels and wherein the at least one shield wire is positioned between signal wires above and below the at least one shield wire.

6. The semiconductor integrated circuit according to claim 1, wherein the signal wires are formed on multiple levels and wherein multiple shield wires are positioned between signal wires on the same level to be shielded and between signal wires above and below the multiple shield wires.

7. The semiconductor integrated circuit according to claim 1, wherein the at least one shield wire is formed of a conductive material.

8. The semiconductor integrated circuit according to claim 1, further comprising a decoupling capacitor in series between at least one of the signal wires to be shielded and the common memory cell voltage source node.

9. A semiconductor integrated circuit including a capacitor-based memory cell array, capacitors in the memory cell array being electrically coupled to a common memory cell voltage source node, said semiconductor integrated circuit comprising:

at least one signal wire; and at least one shield capacitor, a first terminal of said at least one shield capacitor being electrically coupled to the at least one signal wire, and a second terminal of said at least one shield capacitor being electrically coupled to the common memory cell voltage source node.

10. The semiconductor integrated circuit according to claim 9, further comprising at least one shield wire positioned adjacent the at least one signal wire, the at least one shield wire being electrically coupled to the common memory cell voltage source node.

11. The semiconductor integrated circuit according to claim 9, wherein a voltage potential of the common memory cell voltage source node is different than that of an external voltage source.

12. The semiconductor integrated circuit according to claim 9, wherein the at least one shield capacitor comprises a metal oxide silicon (MOS) capacitor.

* * * * *